US008209180B2

(12) United States Patent
Kato

(10) Patent No.: US 8,209,180 B2
(45) Date of Patent: Jun. 26, 2012

(54) SPEECH SYNTHESIZING DEVICE, SPEECH SYNTHESIZING METHOD, AND PROGRAM

(75) Inventor: Masanori Kato, Tokyo (JP)

(73) Assignee: NEC Corporation, Tokyo (JP)

( * ) Notice: Subject to any disclaimer, the term of this patent is extended or adjusted under 35 U.S.C. 154(b) by 976 days.

(21) Appl. No.: 12/223,707

(22) PCT Filed: Feb. 1, 2007

(86) PCT No.: PCT/JP2007/051669
§ 371 (c)(1), (2), (4) Date: Aug. 7, 2008

(87) PCT Pub. No.: WO2007/091475
PCT Pub. Date: Aug. 16, 2007

(65) Prior Publication Data

US 2010/0145706 A1 Jun. 10, 2010

(30) Foreign Application Priority Data

Feb. 8, 2006 (JP) ................................ 2006-031442

(51) Int. Cl.
*G10L 13/00* (2006.01)
*G10L 11/00* (2006.01)
*H03G 3/20* (2006.01)

(52) U.S. Cl. .......................... 704/258; 704/270; 381/57

(58) Field of Classification Search ....................... None
See application file for complete search history.

(56) References Cited

U.S. PATENT DOCUMENTS

| | | | | |
|---|---|---|---|---|
| 6,424,944 | B1 * | 7/2002 | Hikawa | 704/260 |
| 6,446,040 | B1 * | 9/2002 | Socher et al. | 704/260 |
| 6,731,307 | B1 | 5/2004 | Strubbe et al. | |
| 6,915,261 | B2 * | 7/2005 | Barile | 704/265 |
| 6,990,453 | B2 * | 1/2006 | Wang et al. | 704/270 |
| 7,203,647 | B2 | 4/2007 | Hirota et al. | |
| 7,365,260 | B2 * | 4/2008 | Kawashima | 84/600 |
| 7,603,280 | B2 * | 10/2009 | Hirota et al. | 704/278 |

(Continued)

FOREIGN PATENT DOCUMENTS

CN 1061863 A 6/1992

(Continued)

OTHER PUBLICATIONS

Kyu-Phil Han et al., "Genre Classification System of TV Sound Signals Based on a Spectrogram Analysis," IEEE Transactions on Consumer Electronics, 1998 Nen 2 Gatsu, vol. 44, Issue 1, pp. 33-42.

(Continued)

*Primary Examiner* — Brian Albertalli
(74) *Attorney, Agent, or Firm* — Foley & Lardner LLP

(57) ABSTRACT

An object of the present invention is to provide a device and a method for generating a synthesized speech that has an utterance form that matches music. A musical genre estimation unit of the speech synthesizing device estimates the musical genre to which a received music signal belongs, an utterance form selection unit references an utterance form information storage unit to determine an utterance form from the musical genre. A prosody generation unit references a prosody generation rule storage unit, selected from prosody generation rule storage units $\mathbf{15}_1$ to $\mathbf{15}_N$ according to the utterance form, and generates prosody information from a phonetic symbol sequence. A unit waveform selection unit references a unit waveform data storage unit, selected from unit waveform data storage units $\mathbf{16}_1$ to $\mathbf{16}_N$ according to the utterance form, and selects a unit waveform from the phonetic symbol sequence and the prosody information. A waveform generation unit generates a synthesized speech waveform from the prosody information and the unit waveform data.

3 Claims, 10 Drawing Sheets

U.S. PATENT DOCUMENTS

| | | | | |
|---|---|---|---|---|
| 7,684,991 | B2 * | 3/2010 | Stohr et al. | 704/270.1 |
| 2003/0046076 | A1 | 3/2003 | Hirota et al. | |
| 2010/0145702 | A1 * | 6/2010 | Karmarkar | 704/258 |

FOREIGN PATENT DOCUMENTS

| | | | |
|---|---|---|---|
| JP | 5-307395 | A | 11/1993 |
| JP | 08-037700 | | 2/1996 |
| JP | 8-328576 | A | 12/1996 |
| JP | 10-20885 | A | 1/1998 |
| JP | 11-15488 | A | 1/1999 |
| JP | 11-015495 | | 1/1999 |
| JP | 11-161298 | | 6/1999 |
| JP | 2001-309498 | A | 11/2001 |
| JP | 2003-058198 | A | 2/2003 |
| JP | 3595041 | | 9/2004 |
| JP | 2004-361874 | A | 12/2004 |
| JP | 2005-077663 | A | 3/2005 |
| JP | 2007-86316 | A | 4/2007 |
| WO | WO 99/53612 | | 1/1999 |
| WO | WO 02/37474 | A1 | 5/2002 |

OTHER PUBLICATIONS

K. Hoashi et al., "Personalization of User Profiles for Content-based Music Retrieval Based on Relevance Feedback," Proceedings of ACM Multimedia 2003, pp. 110-119.

A. Kimura et al., "High Speed Retrieval of Audio and Video in Which Global Branch Removal is Introduced," Journal of the Institute of Electronics, Information and Comm., D-II, vol. J85-D-II:10; pp. 1552-1562, Oct. 2002.

G. Tzanetakis et al., "Automatic Musical Genre Classification of Audio Signals," Proceedings of ISMIR 2001, pp. 205-210.

* cited by examiner

FIG.2

| MUSICAL GENRE | UTTERANCE FORM | PROSODY GENERATION RULE STORAGE UNIT NUMBER | UNIT WAVEFORM DATA STORAGE UNIT NUMBER |
|---|---|---|---|
| POPS | LOUD VOICE | 1 | 1 |
| EASY LISTENING | COMPOSED VOICE | 2 | 2 |
| RELIGIOUS MUSIC | LOW VOICE | 3 | 3 |
| ⋮ | ⋮ | ⋮ | ⋮ |
| OTHERS | MODERATE VOICE | N | N |

FIG.5

| MUSICAL GENRE | UTTERANCE FORM | PROSODY GENERATION RULE STORAGE UNIT NUMBER | UNIT WAVEFORM DATA STORAGE UNIT NUMBER | POWER RATIO |
|---|---|---|---|---|
| POPS | LOUD VOICE | 1 | 1 | 1.2 |
| EASY LISTENING | COMPOSED VOICE | 2 | 2 | 1.0 |
| RELIGIOUS MUSIC | LOW VOICE | 3 | 3 | 0.9 |
| ····· | ····· | ····· | ····· | ····· |
| OTHERS | MODERATE VOICE | N | N | 1.0 |

SPEECH SYNTHESIZING DEVICE, SPEECH SYNTHESIZING METHOD, AND PROGRAM

This application is the National Phase of PCT/JP2007/051669, filed Feb. 1, 2007, which claims priority to Japanese Application No. 2006-031442, filed Feb. 8, 2006, the disclosures of which are hereby incorporated by reference in their entirety.

TECHNICAL FIELD

The present invention relates to a speech synthesizing technology, and more particularly to a speech synthesizing device, a speech synthesizing method, and a speech synthesizing program for synthesizing a speech from text.

BACKGROUND ART

A recent sophistication and downsizing of a computer allows the speech synthesizing technology to be installed and used in various devices such as a car navigation device, a mobile phone, a PC (Personal computer), a robot, etc. Widespread use of this technology in various devices finds applications in a variety of environments where a speech synthesizing device is used.

In a conventional, commonly-used speech synthesizing device, the processing result of prosody (for example, pitch frequency pattern, amplitude, duration time length) generation, unit waveform (for example, waveform having the length of about pitch length or syllabic sound time length extracted from a natural speech) selection, and waveform generation is basically determined uniquely for a phonetic symbol sequence (text analysis result including reading, syntax/part-of-speech information, accent type, etc.). That is, a speech synthesizing device always performs speech synthesizing in the same utterance form (volume, phonation speed, prosody, and voice tone of a voice) in any situation or environment.

However, the actual observation of human's phonation indicates that, even when the same text is spoken, the utterance form is controlled by the speaker's situation, emotion, or intention. Therefore, a conventional speech synthesizing device, which always uses the same utterance form, does not necessarily make the best use of the characteristics of a speech that is one of communication media.

To solve the problem with a speech synthesizing device like this, an attempt is made to generate a synthesized speech suited for the user environment and to improve the user's usability by dynamically changing the prosody generation and the unit waveform selection according to the user environment (situation and environment of the place where the user of the speech synthesizing device is present). For example, Patent Document 1 discloses the configuration of a speech synthesizing system that selects the control rule for the prosody and phoneme according to the information indicating the light level of the user environment or the user's position.

Patent Document 2 discloses the configuration of a speech synthesizing device that controls the consonant power, pitch frequency, and sampling frequency based on the power spectrum and frequency distribution information on the ambient noises.

In addition, Patent Document 3 discloses the configuration of a speech synthesizing device that controls the phonation speed, pitch frequency, sound volume, and voice quality based on various types of clocking information including the time of day, date, and day of week.

Non-Patent Documents 1-3 that disclose the music signal analysis and search method, which constitute the background technology of the present invention, are given below. Non-Patent Document 1 discloses a genre estimation method that analyzes the short-time amplitude spectrum and the discrete wavelet conversion coefficients of music signals to find musical characteristics (instrument configuration, rhythm structure) for estimating the musical genre.

Non-Patent Document 2 discloses a genre estimation method that estimates the musical genre from the mel-frequency cepstrum coefficients of the music signal using the tree-structured vector quantization method.

Non-Patent Document 3 discloses a method that calculates the similarity using the spectrum histograms for retrieving the musical signal.

Patent Document 1:
Japanese Patent No. 3595041

Patent Document 2:
Japanese Patent Publication Kokai JP-A-11-15495

Patent Document 3:
Japanese Patent Kokai Publication JP-A-11-161298

Non-Patent Document 1:
Tzanetakis, Essl, Cook: "Automatic Musical Genre Classification of Audio Signals", Proceedings of ISMIR 2001, pp. 205-210, 2001.

Non-Patent Document 2:
Hoashi, Matsumoto, Inoue: "Personalization of User Profiles for Content-based Music Retrieval Based on Relevance Feedback", Proceedings of ACM Multimedia 2003, pp. 110-119, 2003.

Non-Patent Document 3:
Kimura et al.: "High-Speed Retrieval of Audio and Video In Which Global Branch Removal Is Introduced", Journal of The Institute of Electronics, Information and Communication Engineers, D-II, Vol. J85-D-II, No. 10, pp. 1552-1562, October, 2002

DISCLOSURE OF THE INVENTION

Problems to be Solved by the Invention

To attract the attention of an audience or to give an impression of a message to an audience, BGM (background music, hereinafter called BGM) is usually played with a natural speech. For example, BGM is played in the background of a narration in many of news programs and information providing programs on TV or radio.

The analysis of those programs indicates that, though BGM, especially the musical genre to which the BGM belongs, is selected according to the utterance form of the speaker, the speaker speaks with consideration for the BGM. For example, in a weather forecast program or a traffic information program, the speaker usually speaks in an even tone with gentle melody BGM, such as easy listening music, playing in the background. Meanwhile, the announcer sometimes speaks same contents in a voice full of life in a special program or a live program.

Blues music is used as the BGM when a poem is read aloud sadly, and the speaker reads aloud the poem emotionally. In addition, we can find the relation that religious music is selected to produce a mystic atmosphere and pops music is selected for a bright way of speaking.

Meanwhile, a speech synthesizing device is used in a variety of environments as described above, and a synthesized speech is output more often in a place (a user environment) where various types of music, including the BGM described above, is reproduced. Nevertheless, the conventional speech synthesizing device, including those described in Patent Document 1 and so on, has a problem that the utterance form does not match the ambient music because the music playing in the user environment cannot be taken into consideration in controlling the utterance form of a synthesized speech.

In view of the foregoing, it is an object of the present invention to provide a speech synthesizing device, a speech synthesizing method, and a program capable of synthesizing a speech that matches the music playing in a user environment.

Means to Solve the Problems

According to a first aspect of the present invention, there is provided a speech synthesizing device that automatically selects an utterance form according to music reproduced in a user environment. More specifically, the speech synthesizing device comprises an utterance form selection unit that analyzes a music signal reproduced in a user environment and determines an utterance form that matches an analysis result of the music signal; and a speech synthesizing unit that synthesizes a speech according to the utterance form.

According to a second aspect of the present invention, there is provided a speech synthesizing method that generates a synthesized speech using a speech synthesizing device, wherein the method comprises a step for analyzing, by the speech synthesizing device, a received music signal reproduced in a user environment and determining an utterance form that matches an analysis result of the music signal; and a step for synthesizing, by the speech synthesizing device, a speech according to the utterance form.

According to a third aspect of the present invention, there is provided a program and a recording medium storing therein the program wherein the program causes a computer, which constitutes a speech synthesizing device, to execute processing for analyzing a received music signal reproduced in a user environment and determining an utterance form, which matches an analysis result of the music signal, from utterance forms prepared in advance; and processing for synthesizing a speech according to the utterance form.

Effect of the Invention

According to the present invention, a synthesized speech can be generated in an utterance form that matches the music such as the BGM in the user environment. As a result, a synthesized speech can be output that attracts the user's attention or that does not spoil the atmosphere of the BGM nor does break the mood of the user listening to the BGM.

BRIEF DESCRIPTION OF THE DRAWINGS

FIG. 2 is a diagram showing an example of a table that defines the relation among a musical genre, an utterance form, and utterance form parameters used in the speech synthesizing device in the first embodiment of the present invention.

FIG. 5 is a diagram showing an example of a table that defines the relation among a musical genre, an utterance form, and utterance form parameters used in the speech synthesizing device in the second embodiment of the present invention.

EXPLANATIONS OF SYMBOLS

Figure 1:
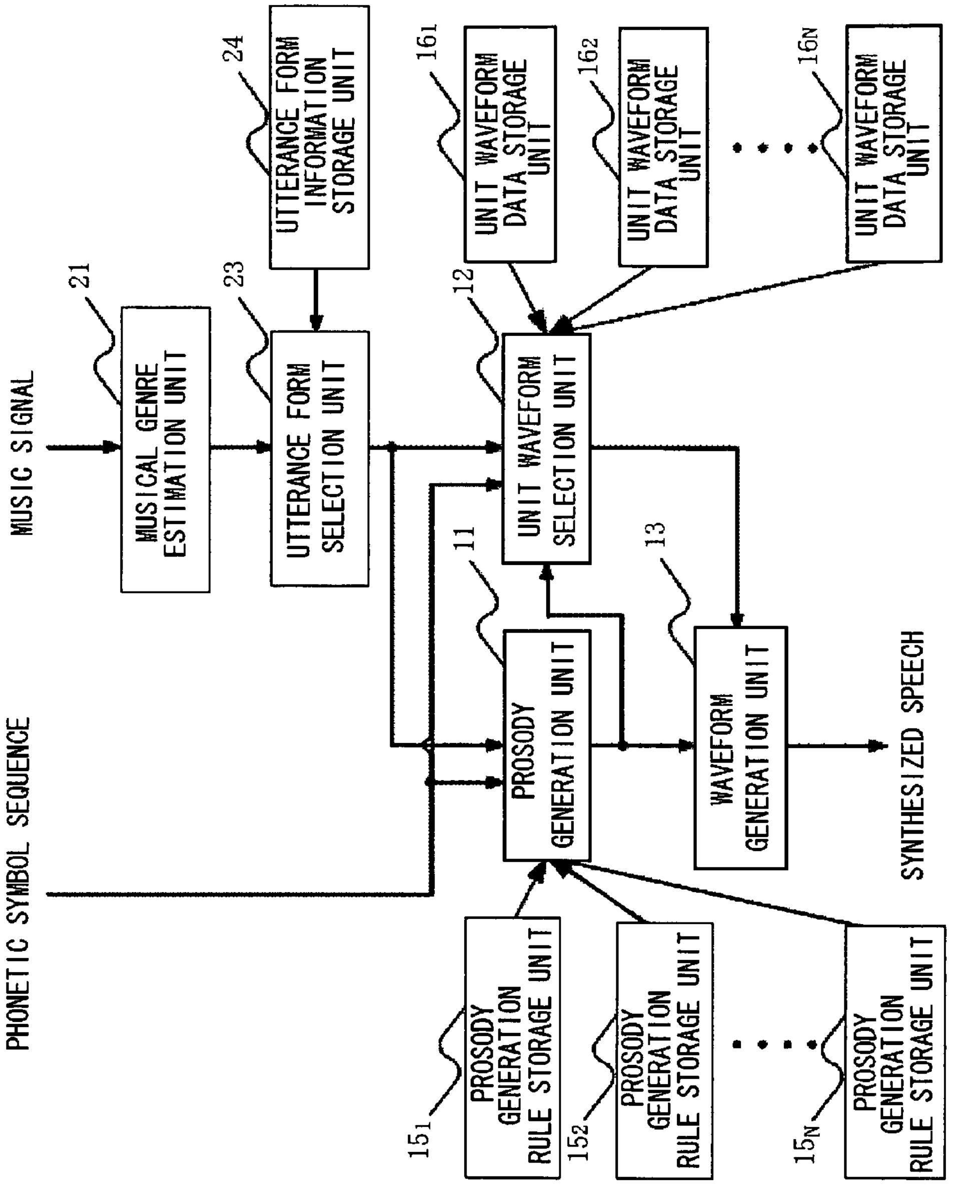
FIG. 1 is a block diagram showing the configuration of a speech synthesizing device in a first embodiment of the present invention.

11 Prosody generation unit
12 Unit waveform selection unit
13 Waveform generation unit
$\mathbf{15}_1$-$\mathbf{15}_N$ Prosody generation rule storage unit
$\mathbf{16}_1$-$\mathbf{16}_N$ Unit waveform data storage unit
17 Synthesized speech power adjustment unit
18 Synthesized speech power calculation unit
19 Music signal power calculation unit
21 Musical genre estimation unit
23, 27 Utterance form selection unit
24, 28 Utterance form information storage unit
31 Music attribute information search unit
32 Music attribute information storage unit
35 Music reproduction unit
36 Reproduced music information acquisition unit
37 Music data storage unit

PREFERRED MODES FOR CARRYING OUT THE INVENTION

First Embodiment

Next, the preferred mode for carrying out the present invention will be described in detail with reference to the drawings. FIG. 1 is a block diagram showing the configuration of a speech synthesizing device in a first embodiment of the present invention. Referring to FIG. 1, the speech synthesizing device in this embodiment comprises a prosody generation unit 11, a unit waveform selection unit 12, a waveform generation unit 13, prosody generation rule storage units $\mathbf{15}_1$ to $\mathbf{15}_N$, unit waveform data storage units $\mathbf{16}_1$ to $\mathbf{16}_N$, a musical genre estimation unit 21, an utterance form selection unit 23, and an utterance form information storage unit 24.

The prosody generation unit 11 is processing means for generating prosody information from the prosody generation rule, selected based on an utterance form, and a phonetic symbol sequence.

The unit waveform selection unit 12 is processing means for selecting a unit waveform from unit waveform data, selected based on an utterance form, a phonetic symbol sequence, and prosody information.

The waveform generation unit 13 is processing means for generating a synthesized speech waveform from prosody information and unit waveform data.

The prosody generation rule (for example, pitch frequency pattern, amplitude, duration time length, etc.), required for producing a synthesized speech in each utterance form, is saved in the prosody generation rule storage units $15_1$ to $15_N$.

As in the prosody generation rule storage units, unit waveform data (for example, waveform having the length of about pitch length or syllabic sound time length extracted from a natural speech), required for producing a synthesized speech in each utterance form, is saved in the unit waveform data storage units $16_1$ to $16_N$.

The prosody generation rules and the unit waveform data, which should be saved in the prosody generation rule storage units $15_1$ to $15_N$ and the unit waveform data storage units $16_1$ to $16_N$, can be generated by collecting and analyzing the natural speeches that match the utterance forms.

In the description of the embodiments given below, it is assumed that the prosody generation rule and the unit waveform data generated from a loud voice and required for producing a loud voice are saved in the prosody generation rule storage unit $15_1$ and the unit waveform data storage unit $16_1$, the prosody generation rule and the unit waveform data generated from a composed voice and required for producing a composed voice are saved in the prosody generation rule storage unit $15_2$ and the unit waveform data storage unit $16_2$, the prosody generation rule and the unit waveform data generated from a low voice are saved in the prosody generation rule storage unit $15_3$ and the unit waveform data storage unit $16_3$, and the prosody generation rule and the unit waveform data generated from a moderate voice are saved in the prosody generation rule storage unit $15_N$ and the unit waveform data storage unit $16_N$. The method for generating the prosody generation rule and the unit waveform data from a natural speech does not depend on the utterance form, but the method similar to that for generating them from a moderate voice can be used.

The musical genre estimation unit 21 is processing means for estimating a musical genre to which a received music signal belongs.

The utterance form selection unit 23 is processing means for determining an utterance form from a musical genre estimated based on the table saved in the utterance form information storage unit 24.

The table, shown in FIG. 2, that defines the relation among a musical genre, an utterance form, and utterance form parameters is saved in the utterance form information storage unit 24. The utterance form parameters are a prosody generation rule storage unit number and a unit waveform data storage unit number. By combining the prosody generation rule and the unit waveform data corresponding to the numbers, a synthesized speech in a specific utterance form is produced. Although both the utterance form and the utterance form parameters are defined in the example in FIG. 2 for the sake of description, the utterance form selection unit 23 uses only the utterance form parameters and so the definition of the utterance form may be omitted.

Conversely, another configuration is also possible in which the only relation between a musical genre and an utterance form is defined in the utterance form information storage unit 24 and, for the correspondence among an utterance form, a prosody generation rule, and unit waveform data, the prosody generation unit 11 and the unit waveform selection unit 12 are allowed to select the prosody generation rule and the unit waveform data according to the utterance form.

Although many utterance forms are prepared in the example shown in FIG. 2, it is also possible that only the unit waveform data on one type of utterance form is prepared and the utterance form is switched by changing the prosody generation rule. In this case, the storage capacity and the processing amount of the speech synthesizing device can be reduced.

In addition, the correspondence between musical genre information and an utterance form defined in the utterance form information storage unit 24 described above may be changed to suit the user's preference or may be selected from the combinations of multiple correspondences, prepared in advance, to suit the user's preference.

Figure 3:
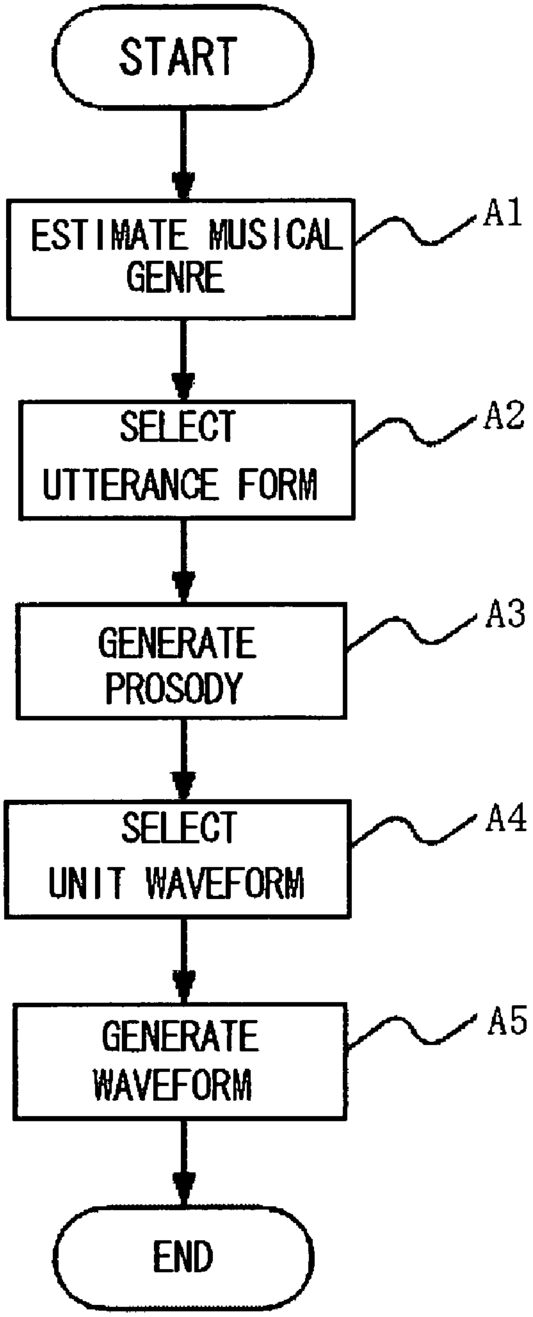
FIG. 3 is a flowchart showing the operation of the speech synthesizing device in the first embodiment of the present invention.

Next, the following describes the operation of the speech synthesizing device in this embodiment in detail with reference to the drawings. FIG. 3 is a flowchart showing the operation of the speech synthesizing device in this embodiment. Referring to FIG. 3, the musical genre estimation unit 21 first extracts the characteristic amount of the music signal, such as the spectrum and cepstrum, from the received music signal, estimates the musical genre to which the received music belongs, and outputs the estimated musical genre to the utterance form selection unit 23 (step A1). The known method described in Non-Patent Document 1, Non-Patent Document 2, etc., given above may be used for this musical genre estimation method.

If there is no BGM or if the genre of the received music is a genre that is none of those anticipated, not a specific genre name but "others" is output to the utterance form selection unit 23 as the musical genre.

Next, the utterance form selection unit 23 selects the corresponding utterance form from the table (see FIG. 2) stored in the utterance form information storage unit 24 based on the estimated musical genre sent from the musical genre estimation unit 21, and sends the utterance form parameters, required for producing the selected utterance form, to the prosody generation unit 11 and the unit waveform selection unit 12 (step A2).

According to FIG. 2, the loud voice is selected as the utterance form if the estimated musical genre is a pops, the composed voice is selected for easy listening music, and the low voice is selected for religious music. If the estimated musical genre is not in the table in FIG. 2, the moderate utterance form is selected in the same way as when the musical genre is "others".

Next, the prosody generation unit 11 references the utterance form parameter supplied from the utterance form selection unit 23 and selects the prosody generation rule storage unit, which has the storage unit number specified by the utterance form selection unit 23, from the prosody generation rule storage units $15_1$ to $15_N$. After that, based on the prosody generation rule in the selected prosody generation rule storage unit, the prosody generation unit 11 generates prosody information from the received phonetic symbol sequence and sends the generated prosody information to the unit waveform selection unit 12 and the waveform generation unit 13 (step A3).

Next, the unit waveform selection unit 12 references the utterance form parameter sent from the utterance form selection unit 23 and selects the unit waveform data storage unit, which has the storage unit number specified by the utterance form selection unit 23, from the unit waveform data storage units $16_1$ to $16_N$. After that, based on the received phonetic symbol sequence and the prosody information supplied from the prosody generation unit 11, the unit waveform selection unit 12 selects a unit waveform from the selected unit waveform data storage unit, and sends the selected unit waveform to the waveform generation unit 13 (step A4).

Finally, based on the prosody information sent from the prosody generation unit 11, the waveform generation unit 13 connects the unit waveform, supplied from the unit waveform selection unit 12, and outputs the synthesized speech signal (step A5).

As described above, a synthesized speech can be generated in this embodiment in the utterance form produced by the prosody and the unit waveform that match the BGM in the user environment.

Although the embodiment described above has the configuration in which the unit waveform data storage units $\mathbf{16}_1$ to $\mathbf{16}_N$ are prepared, one for each utterance form, another configuration is also possible in which the unit waveform data storage unit is provided only for the moderate voice. In this case, though the utterance form is controlled only by the prosody generation rule, this configuration has the advantage of significantly reducing the storage capacity of the whole synthesizing device because the size of the unit waveform data is larger than that of other data such as the prosody generation rule.

Second Embodiment

In the first embodiment described above, the power of the synthesized speech is not controlled but the synthesized speech is assumed to have the same power both when the synthesized speech is output in a low voice and when the synthesized speech is output in a loud voice. For example, depending upon the correspondence between the BGM and the utterance form, if the sound volume of the synthesized speech is too larger than that of the background music, the balance is lost and, in some cases, the speech is offensive to the ear. Conversely, if the sound volume of the synthesized speech is too smaller than that of the background music, not only the balance is lost but also, in some cases, it becomes difficult to hear the synthesized speech.

Figure 4:
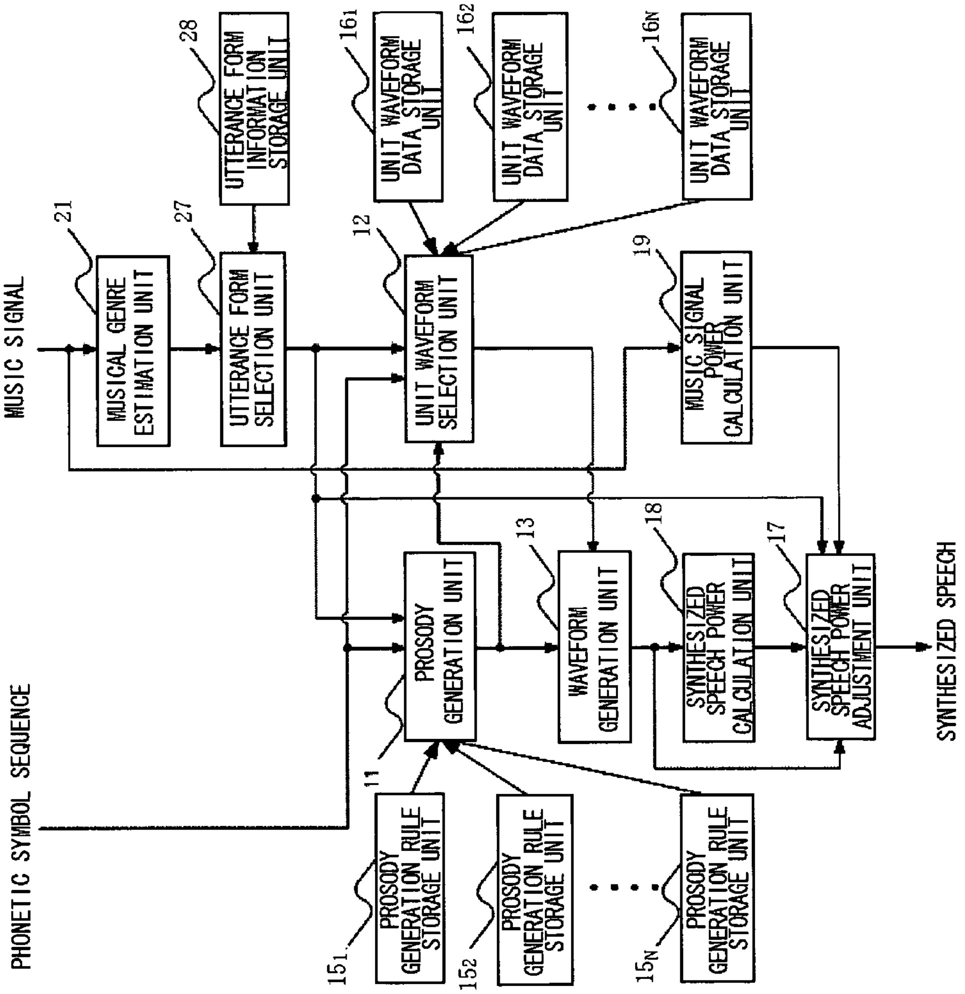
FIG. 4 is a block diagram showing the configuration of a speech synthesizing device in a second embodiment of the present invention.

A second embodiment of the present invention, in which an improvement is added to the above-described configuration in such a way that the power of the synthesized speech is controlled, will be described in detail below with reference to the drawings. FIG. 4 is a block diagram showing the configuration of a speech synthesizing device in the second embodiment of the present invention.

Referring to FIG. 4, the speech synthesizing device in this embodiment has the configuration of the speech synthesizing device in the first embodiment described above (see FIG. 1) to which a synthesized speech power adjustment unit 17, a synthesized speech power calculation unit 18, and a music signal power calculation unit 19 are added. In addition, as shown in FIG. 4, an utterance form selection unit 27 and an utterance form information storage unit 28 are provided in this embodiment instead of the utterance form selection unit 23 and the utterance form information storage unit 24 in the first embodiment.

The table, shown in FIG. 5, that defines the relation among a musical genre, an utterance form, and utterance form parameters is saved in the utterance form information storage unit 28. This table is different from the table (see FIG. 2) held in the utterance form information storage unit 24 in the first embodiment described above in that the power ratio is added.

This power ratio is a value generated by dividing the power of the synthesized speech by the power of the music signal. That is, a power ratio higher than 1.0 indicates that the power of the synthesized speech is higher than the power of the music signal. For example, referring to FIG. 5, when the musical genre is estimated as a pops, the utterance form is set to a loud voice and the power ratio is set to 1.2 with the result that the synthesized speech power is output higher than (1.2 times) that of the music signal power. Similarly, the power ratio is set to 1.0 when the utterance form is a composed voice, is set to 0.9 when the utterance form is a low voice, and is set to 1.0 when the utterance form is a moderate voice.

Figure 6:
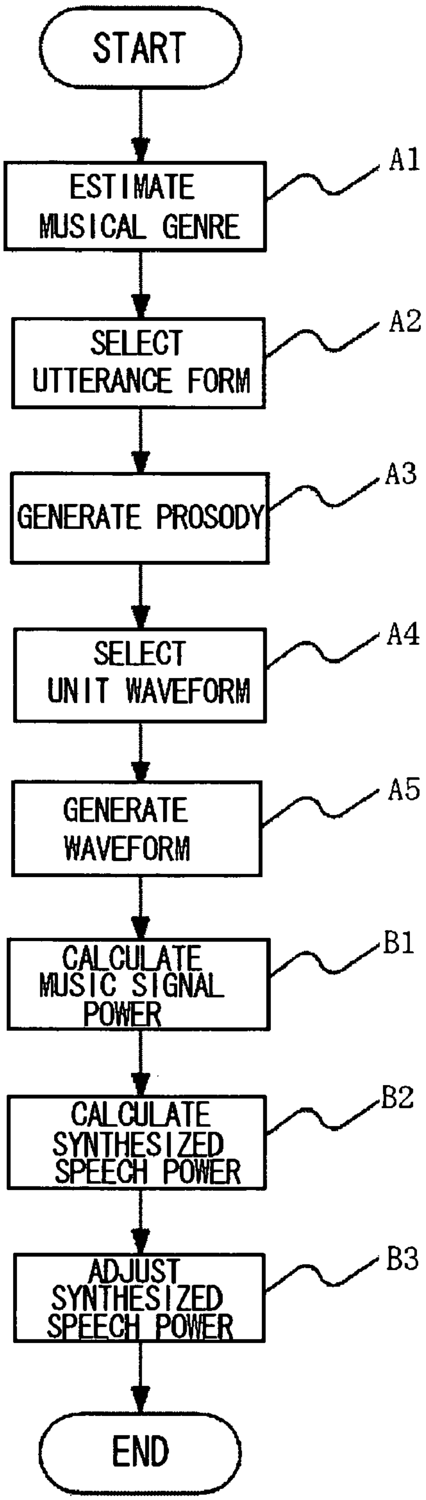
FIG. 6 is a flowchart showing the operation of the speech synthesizing device in the second embodiment of the present invention.

Next, the following describes the operation of the speech synthesizing device in this embodiment in detail with reference to the drawings. FIG. 6 is a flowchart showing the operation of the speech synthesizing device in this embodiment. The processing from the musical genre estimation (step A1) to the waveform generation (step A5) is almost similar to that in the first embodiment described above except that, in step A2, the utterance form selection unit 27 sends a power ratio, stored in the utterance form information storage unit 28, to the synthesized speech power adjustment unit 17 based on the estimated musical genre sent from the musical genre estimation unit 21 (step A2).

When the waveform generation is completed in step A5, the music signal power calculation unit 19 calculates the average power of the received music signal and sends the resulting value to the synthesized speech power adjustment unit 17 (step B1). The average power $P_m(n)$ of the music signal can be calculated by the linear leaky integration, such as the expression (1) given below, where n is the sample number of the signal and x(n) is the music signal.

$$P_m(n)=aP_m(n-1)+(1-a)x^2(n) \qquad \text{[Expression 1]}$$

Note that a is the time constant of the linear leaky integration. Because the power is calculated to prevent the difference between the synthesized speech and the average sound volume of the BGM from increasing, it is desirable that a be set to a large value, such as 0.9, to calculate a long-time average power. Conversely, if the power is calculated with a small value, such as 0.1, assigned to a, the sound volume of the synthesized speech is changed frequently and greatly and, as a results, there is a possibility that the synthesized speech becomes difficult to hear. Instead of the expression given above, it is also possible to use the moving average or the average of all samples of the received signals.

Next, the synthesized speech power calculation unit 18 calculates the average power of the synthesized speech supplied from the waveform generation unit 13 and sends the calculated average power to the synthesized speech power adjustment unit 17 (step B2). The same method as that used in calculating the music signal power described above can be used also for the calculation of the synthesized speech power.

Finally, the synthesized speech power adjustment unit 17 adjusts the power of the synthesized speech signal supplied from the waveform generation unit 13, based on the music signal power supplied from the music signal power calculation unit 19, the synthesized speech power supplied from the synthesized speech power calculation unit 18, and the power ratio included in the utterance form parameters supplied from the utterance form selection unit 27, and outputs resulting value as the power-adjusted speech synthesizing signal (step B3). More specifically, the synthesized speech power adjustment unit 17 adjusts the power of the synthesized speech so that the ratio between the power of the finally-output synthesized speech signal and the power of the music signal becomes closer to the power ratio value supplied from the utterance form selection unit 27.

More clearly, the music signal power, the synthesized speech signal power, and the power ratio are used to calculate the power adjustment coefficient that is multiplied by the synthesized speech signal. Therefore, as the power adjustment coefficient, a value must be used that makes the ratio between the power of the music signal and the power of the power-adjusted synthesized speech almost equal to the power ratio supplied from the utterance form selection unit 27. The power adjustment coefficient c is given by the following expression where $P_m$ is the music signal power, $P_s$ is the synthesized speech power, and r is the power ratio.

$$c = \sqrt{\frac{P_m}{P_s} r}$$ [Expression 2]

The power-adjusted synthesized speech signal $y_2(n)$ is given by the following expression where $y_1(n)$ is the synthesized speech signal before the adjustment.

$$y_2(n) = cy_1(n)$$ [Expression 3]

As described above, more flexible control is possible in which the synthesized speech power is generated as a voice slightly louder than the moderate voice when a loud voice is selected and the power is slightly reduced when a low voice is selected. In this way, it is possible to implement the utterance form that can ensure a good balance between the synthesized speech and the BGM.

Third Embodiment

Figure 7:
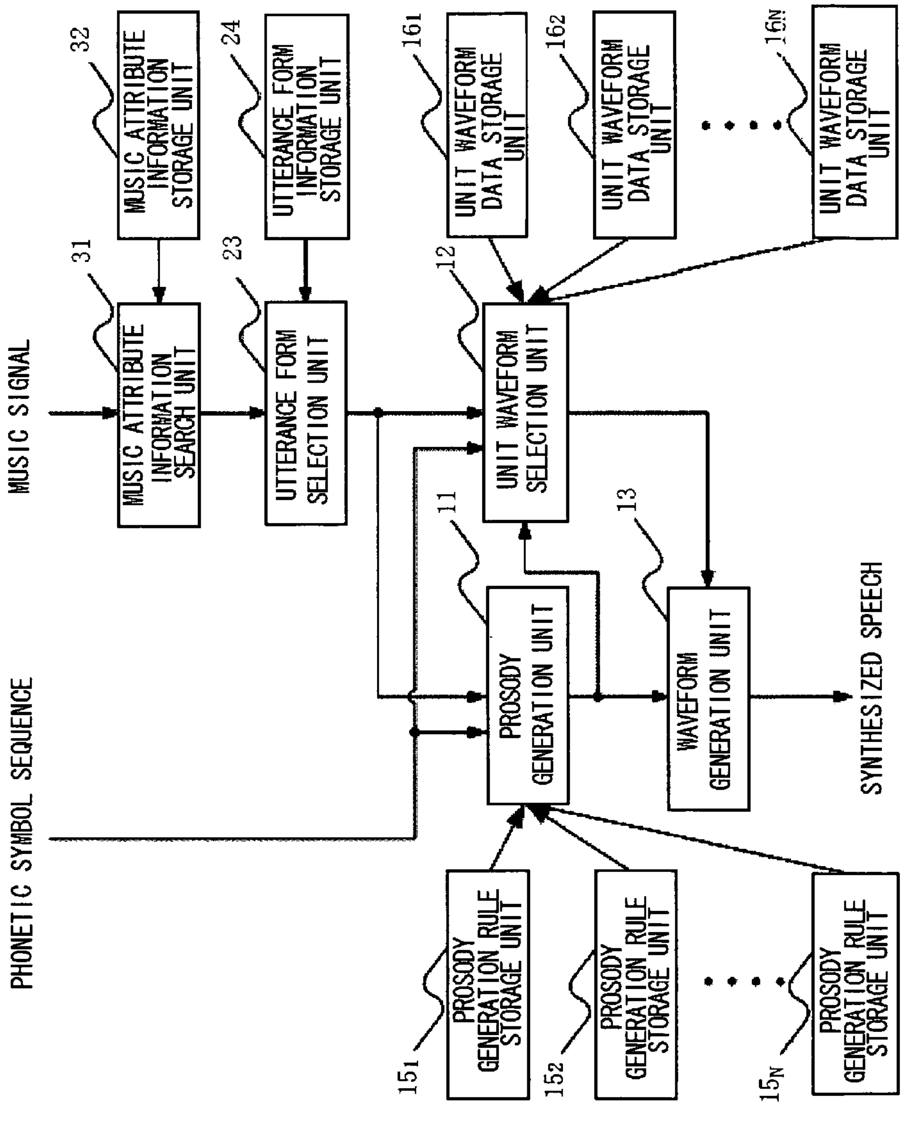
FIG. 7 is a block diagram showing the configuration of a speech synthesizing device in a third embodiment of the present invention.

Although the genre of the received music is estimated in the first and second embodiments described above, it is also possible to use recently-introduced search and checking methods to analyze the received music more accurately. A third embodiment of the present invention, in which the above-described improvement is added, will be described in detail below with reference to the drawings. FIG. 7 is a block diagram showing the configuration of a speech synthesizing device in the third embodiment of the present invention.

Referring to FIG. 7, the speech synthesizing device in this embodiment has the configuration of the speech synthesizing device in the first embodiment described above (see FIG. 1) to which a music attribute information storage unit 32 is added and in which the musical genre estimation unit 21 is replaced by a music attribute information search unit 31.

The music attribute information search unit 31 is processing means for extracting the characteristic amount, such as a spectrum, from the received music signal. The characteristic amounts of various music signals and the musical genres of those music signals are recorded individually in the music attribute information storage unit 32 so that music can be identified, and its genre can be determined, by checking the characteristic amount.

To search for the music signal using the characteristic amount described above, the method for calculating the similarity in the spectrum histograms, described in Non-Patent Document 3, can be used.

Figure 8:
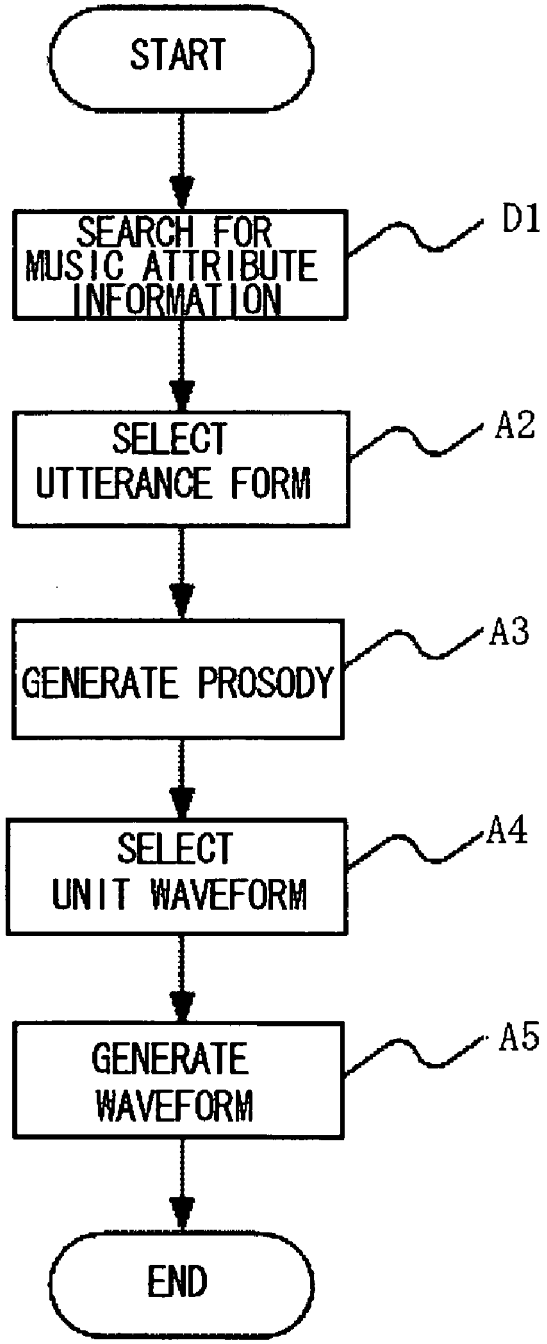
FIG. 8 is a flowchart showing the operation of the speech synthesizing device in the third embodiment of the present invention.

Next, the following describes the operation of the speech synthesizing device in this embodiment in detail with reference to the drawings. FIG. 8 is a flowchart showing the operation of the speech synthesizing device in this embodiment. Because the operation is the same as that in the first embodiment described above except the part of the music genre estimation (step A1) and the other part is already described, the following describes step D1 in FIG. 8 in detail.

First, the music attribute information search unit 31 extracts the characteristic amount, such as a spectrum, from the received music signal. Next, the music attribute information search unit 31 calculates the similarity between all characteristic amounts of the music saved in the music attribute information storage unit 32 and the characteristic amount of the received music signal. After that, the musical genre information on the music having the highest similarity is sent to the utterance form selection unit 23 (step D1).

If the maximum of the similarity is lower than the pre-set threshold in step D1, the music attribute information search unit 31 determines that the music corresponding to the received music signal is not recorded in the music attribute information storage unit 32 and outputs "others" as the musical genre.

As described above, because this embodiment uses the music attribute information storage unit 32 in which a musical genre is recorded individually for each piece of music, this embodiment can identify a musical genre more accurately than the first and second embodiments described above and can reflect the genre on the utterance form.

The attribute information such as a title, an artist name, and a composer's name, if stored when the music attribute information storage unit 32 is built, allows the utterance form to be determined also by the attribute information other than the musical genre.

When a larger number of music types are stored in the music attribute information storage unit 32, the genres of more music signals can be identified but the capacity of the music attribute information storage unit 32 becomes larger. It is also possible to use a configuration as necessary in which, with the music attribute information storage unit 32 installed outside the speech synthesizing device, wired or wireless communication means is used to access the music attribute information storage unit 32 for calculating the similarity of the characteristic amount of the music signal.

Next, a fourth embodiment of the present invention, in which the reproduction function of music, such as BGM, is added to the speech synthesizing device in the first embodiment described above, will be described in detail below with reference to the drawings.

Fourth Embodiment

Figure 9:
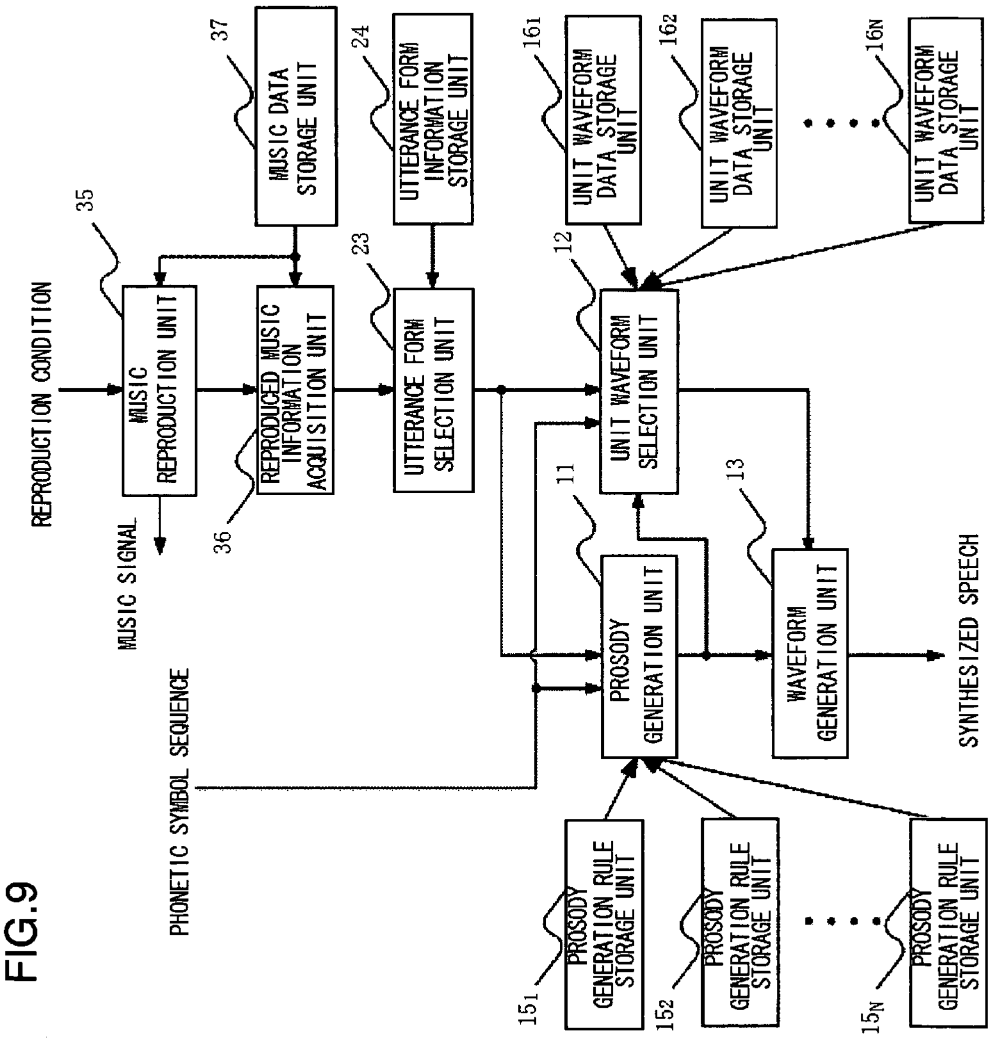
FIG. 9 is a block diagram showing the configuration of a speech synthesizing device in a fourth embodiment of the present invention.

FIG. 9 is a block diagram showing the configuration of a speech synthesizing device in the fourth embodiment of the present invention. Referring to FIG. 9, the speech synthesizing device in this embodiment has the configuration of the speech synthesizing device in the first embodiment described above (see FIG. 1) to which a music reproduction unit 35 and a music data storage unit 37 are added and in which the musical genre estimation unit 21 is replaced by a reproduced music information acquisition unit 36.

Music signals as well as the music numbers and musical genres of the music are saved in the music data storage unit 37. The music reproduction unit 35 is means for outputting music signals, saved in the music data storage unit 37, via a speaker or an ear phone according to a music number, a sound volume, and reproduction commands such as reproduction, stop, rewind, and fast-forwarding. The music reproduction unit 35 supplies the music number of music, which is being reproduced, to the reproduced music information acquisition unit 36.

The reproduced music information acquisition unit 36 is processing means, equivalent to the musical genre estimation unit 21 in the first embodiment, that acquires the musical genre information, corresponding to a music number supplied from the music reproduction unit 35, from the music data storage unit 37 and sends the retrieved information to the utterance form selection unit 23.

Figure 10:
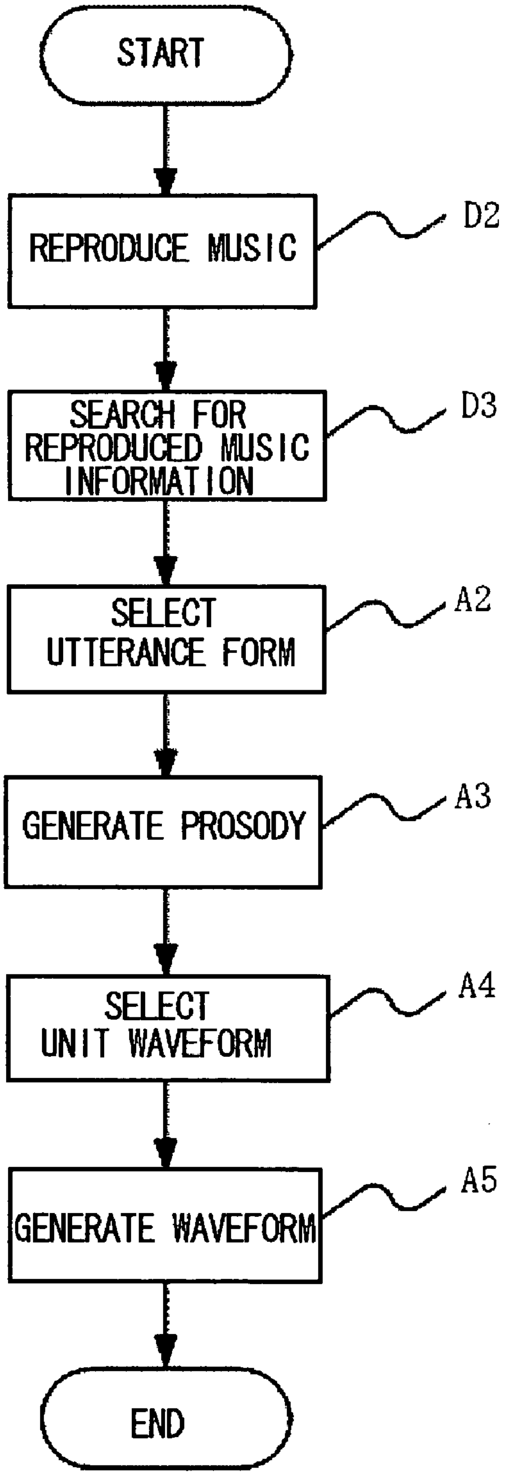
FIG. 10 is a flowchart showing the operation of the speech synthesizing device in the fourth embodiment of the present invention.

Next, the following describes the operation of the speech synthesizing device in this embodiment in detail with reference to the drawings. FIG. 10 is a flowchart showing the operation of the speech synthesizing device in this embodiment. Because the operation is the same as that in the first embodiment described above except the part of the music genre estimation (step A1) and the other part is already described, the following describes steps D2 and D3 in FIG. 10 in detail.

When the music reproduction unit 35 reproduces specified music, the music number is supplied to the reproduced music information acquisition unit 36 (step D2).

The reproduced music information acquisition unit 36 acquires the genre information on the music, corresponding to the music number supplied from the music reproduction unit 35, from the music data storage unit 37 and sends it to the utterance form selection unit 23 (step D3).

This embodiment eliminates the need for the estimation processing and the search processing of a musical genre and allows the musical genre of the BGM, which is being reproduced, to be reliably identified. Of course, if the music reproduction unit 35 can acquire the genre information on the music, which is being reproduced, directly from the music data storage unit 37, another configuration is also possible in which there is no reproduced music information acquisition unit 36 and the musical genre is supplied directly from the music reproduction unit 35 to the utterance form selection unit 23.

If musical genre information is not recorded in the music data storage unit 37, another configuration is also possible in which the musical genre is estimated using the musical genre estimation unit 21 instead of the reproduced music information acquisition unit 36.

If music attribute information other than genres is recorded in the music data storage unit 37, it is also possible to change the utterance form selection unit 23 and the utterance form information storage unit 24 so that the utterance form can be determined by the attribute information other than genres as described in the third embodiment described above.

While the embodiments of the present invention have been described, the technical scope of the present invention is not limited to the embodiments described above but various modifications may be added, or an equivalent may be used, according to the use and the specifications of the speech synthesizing device.

The invention claimed is:

1. A speech synthesizing device comprising:

an utterance form selection unit that analyzes a music signal reproduced in a user environment and determines an utterance form that matches an analysis result of the music signal;

a speech synthesizing unit that synthesizes a speech according to the utterance form;

a music signal power calculation unit that analyzes the music signal and calculates a power of the music signal;

a synthesized speech power calculation unit that analyzes the synthesized speech waveform and calculates a power of the synthesized speech; and a synthesized speech power adjustment unit that references a ratio predetermined for each utterance form between a power of the music signal and a power of the synthesized speech and adjusts a power of the synthesized speech waveform, generated according to the utterance form, according to the power of the music signal.

2. A speech synthesizing method that generates a synthesized speech using a speech synthesizing device, said method comprising:

analyzing, by said speech synthesizing device, a music signal reproduced in a user environment and determining an utterance form that matches an analysis result of the music signal;

synthesizing, by said speech synthesizing device, a speech according to the utterance form;

analyzing, by said speech synthesizing device, the music signal and calculating a power of the music signal;

analyzing, by said speech synthesizing device, the synthesized speech waveform and calculating a power of the synthesized speech; and referencing, by said speech synthesizing device, a ratio predetermined for each utterance form between a power of the music signal and a power of the synthesized speech and adjusting a power of the synthesized speech waveform, generated according to the utterance form, according to the power of the music signal.

3. A non-transitory computer readable medium storing a computer program causing a computer, which constitutes a speech synthesizing device, to execute:

processing for analyzing a received music signal reproduced in a user environment and determining an utterance form, which matches an analysis result of the music signal, from utterance forms prepared in advance; processing for synthesizing a speech according to the utterance form;

processing for analyzing the music signal and estimating a musical genre to which the music belongs;

processing for selecting an utterance form according to the musical genre to determine the utterance form that matches the analysis result of the music signal:

processing for analyzing the music signal and calculating a power of the music signal;

processing for analyzing the synthesized speech waveform and calculating a power of the synthesized speech; and processing for referencing a ratio predetermined for each utterance form between a power of the music signal and a power of the synthesized speech and adjusting a power of the synthesized speech waveform, generated according to the utterance form, according to the power of the music signal.

* * * * *